(12) United States Patent
Chen et al.

(10) Patent No.: US 10,879,881 B1
(45) Date of Patent: Dec. 29, 2020

(54) DEVICE WITH A NOISE SHAPING FUNCTION IN SAMPLING FREQUENCY CONTROL

(71) Applicant: BlueX Microelectronics ( Hefei ) Co., Ltd., Hefei (CN)

(72) Inventors: Hao-Ming Chen, Hsinchu County (TW); Yi-Chun Lu, Hsinchu County (TW); Hongyu Li, Palo Alto, CA (US)

(73) Assignee: BlueX Microelectronics ( Hefei ) Co., Ltd., Anhui (CN)

( * ) Notice: Subject to any disclaimer, the term of this patent is extended or adjusted under 35 U.S.C. 154(b) by 0 days.

(21) Appl. No.: 16/876,106

(22) Filed: May 17, 2020

(51) Int. Cl.
| | | |
|---|---|---|
| *H03K 5/1252* | (2006.01) | |
| *H03K 3/037* | (2006.01) | |
| *H03M 3/00* | (2006.01) | |

(52) U.S. Cl.
CPC ........... *H03K 5/1252* (2013.01); *H03K 3/037* (2013.01); *H03M 3/422* (2013.01)

(58) Field of Classification Search
CPC ....... H03M 3/422–434; H03L 2207/50; H03B 29/00; H03B 28/00
See application file for complete search history.

(56) References Cited

U.S. PATENT DOCUMENTS

| | | | | |
|---|---|---|---|---|
| 7,405,682 | B2* | 7/2008 | Ebner | H03M 3/384 |
| | | | | 341/120 |
| 7,852,249 | B2* | 12/2010 | Oliaei | H03M 3/37 |
| | | | | 341/143 |
| 8,390,494 | B2* | 3/2013 | Chae | H03M 3/446 |
| | | | | 341/143 |
| 9,184,765 | B1* | 11/2015 | Wang | H03M 3/322 |
| 9,276,602 | B1* | 3/2016 | Pagnanelli | H04L 27/362 |
| 9,467,163 | B1* | 10/2016 | Imaizumi | H03M 3/32 |
| 10,411,726 | B2* | 9/2019 | Kim | H03M 3/426 |
| 10,784,888 | B2* | 9/2020 | Mallinson | H03M 3/438 |
| 2018/0269885 | A1* | 9/2018 | Kondo | H04B 1/16 |

* cited by examiner

*Primary Examiner* — Thomas J. Hiltunen
(74) *Attorney, Agent, or Firm* — Winston Hsu

(57) ABSTRACT

A device with a noise shaping function in sampling frequency control includes a first adder, an N-bit quantizer, a mapping circuit, a second adder, a first D flip-flop, a scaler, and a second D flip-flop. The first adder generates a first value according to an input signal, a second value, and a third value. The N-bit quantizer outputs a codeword to a controller according to the first value. Frequency adjusting orders corresponding to codewords outputted by the N-bit quantizer are between a smallest predetermined negative value and a largest positive predetermined value, the controller utilizes an adjusting order corresponding to the codeword to make a frequency generator generate adjusted sampling frequency, and N is an integer greater than 2. The first D flip-flop, the scaler, and the second D flip-flop are used for providing a high-pass filter effect to the device.

13 Claims, 2 Drawing Sheets

DEVICE WITH A NOISE SHAPING FUNCTION IN SAMPLING FREQUENCY CONTROL

BACKGROUND OF THE INVENTION

1. Field of the Invention

The present invention relates to a device in sampling frequency control, and particularly to a device with a noise shaping function in sampling frequency control.

2. Description of the Prior Art

A crystal oscillator (e.g. quartz crystal resonator, Xtal) can be usually utilized to generate a sampling frequency of an integrated circuit (e.g. a communication integrated circuit, an audio integrated circuit, or a sensing integrated circuit). Sometimes, the sampling frequency generated by the crystal oscillator is inaccurate, resulting in the integrated circuit operating abnormally.

When the sampling frequency generated by the crystal oscillator is inaccurate, the prior art can control the crystal oscillator to adjust the sampling frequency step by step (e.g. the prior art can utilize a voltage applied to the crystal oscillator to control the crystal oscillator to adjust the sampling frequency) to generate an adjusted sampling frequency until the adjusted sampling frequency is gradually close to a target sampling frequency. For example, when the sampling frequency is less than the target sampling frequency, the prior art can increase the sampling frequency by 1 ppm increment to generate the adjusted sampling frequency; and when the sampling frequency is greater than the target sampling frequency, the prior art can decrease the sampling frequency by 1 ppm decrement to generate the adjusted sampling frequency.

Although the prior art can adjust the sampling frequency step by step to generate the adjusted sampling frequency until the adjusted sampling frequency is gradually close to the target sampling frequency, noise is caused by discontinuous change of the adjusted sampling frequency during a process of the adjusted sampling frequency being gradually close to the target sampling frequency. Therefore, how to suppress the noise during the process of the adjusted sampling frequency being gradually close to the target sampling frequency becomes an important issue.

SUMMARY OF THE INVENTION

An embodiment of the present invention provides a device with a noise shaping function in sampling frequency control. The device includes a first adder, an N-bit quantizer, a mapping circuit, a second adder, a first D flip-flop, a scaler, and a D flip-flop. The first adder is used for generating a first value according to an input signal, a second value, and a third value. The N-bit quantizer is coupled to the first adder for outputting a codeword to a controller according to the first value, wherein the codeword is mapped to an adjusting order, adjusting orders corresponding to codewords outputted by the N-bit quantizer are between a smallest predetermined negative value and a largest positive predetermined value, the controller generates a control signal to a frequency generator according to the adjusting order, the frequency generator adjusts a current sampling frequency to generate an adjusted sampling frequency according to the control signal, and N is an integer greater than 2. The mapping circuit is coupled to the N-bit quantizer for outputting a mapping value according to the codeword. The second adder is coupled to the first adder, the N-bit quantizer, and the mapping circuit for generating the second value according to the mapping value and the first value. The first D flip-flop is coupled to the second adder for latching the second value. The scaler is coupled to the first D flip-flop and the first adder for scaling the second value to generate the third value. The second D flip-flop is coupled to the first adder, the scaler, and the first D flip-flop for latching the second value and outputting the second value to the first adder.

Another embodiment of the present invention provides a device with a noise shaping function in sampling frequency control. The device includes a first adder, a controller, a frequency generator, an N-bit quantizer, a mapping circuit, a second adder, a first D flip-flop, a scaler, and a D flip-flop. The first adder is used for generating a first value according to an input signal, a second value, and a third value. The N-bit quantizer is coupled to the first adder for outputting a codeword to the controller according to the first value, wherein the codeword is mapped to an adjusting order, adjusting orders corresponding to codewords outputted by the N-bit quantizer are between a smallest predetermined negative value and a largest positive predetermined value, the controller generates a control signal to the frequency generator according to the adjusting order, the frequency generator adjusts a current sampling frequency to generate an adjusted sampling frequency according to the control signal, and N is an integer greater than 2. The mapping circuit is coupled to the N-bit quantizer for outputting a mapping value according to the codeword. The second adder is coupled to the first adder, the N-bit quantizer, and the mapping circuit for generating the second value according to the mapping value and the first value. The first D flip-flop is coupled to the second adder for latching the second value. The scaler is coupled to the first D flip-flop and the first adder for scaling the second value to generate the third value. The second D flip-flop is coupled to the first adder, the scaler, and the first D flip-flop for latching the second value and outputting the second value to the first adder.

The present invention provides a device with a noise shaping function in sampling frequency control. The present invention first makes change of an adjusted sampling frequency be discontinuous, and then utilizes differentiation characteristic and the high-pass filter effect characteristic of the device to make noise caused by the discontinuous change of the adjusted sampling frequency be moved to a higher frequency outside a frequency range utilized by an integrated circuit. Therefore, compared to the prior art, noise fallen in the frequency range utilized by the integrated circuit can be effectively suppressed because the noise caused by the discontinuous change of the adjusted sampling frequency has been moved to the higher frequency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
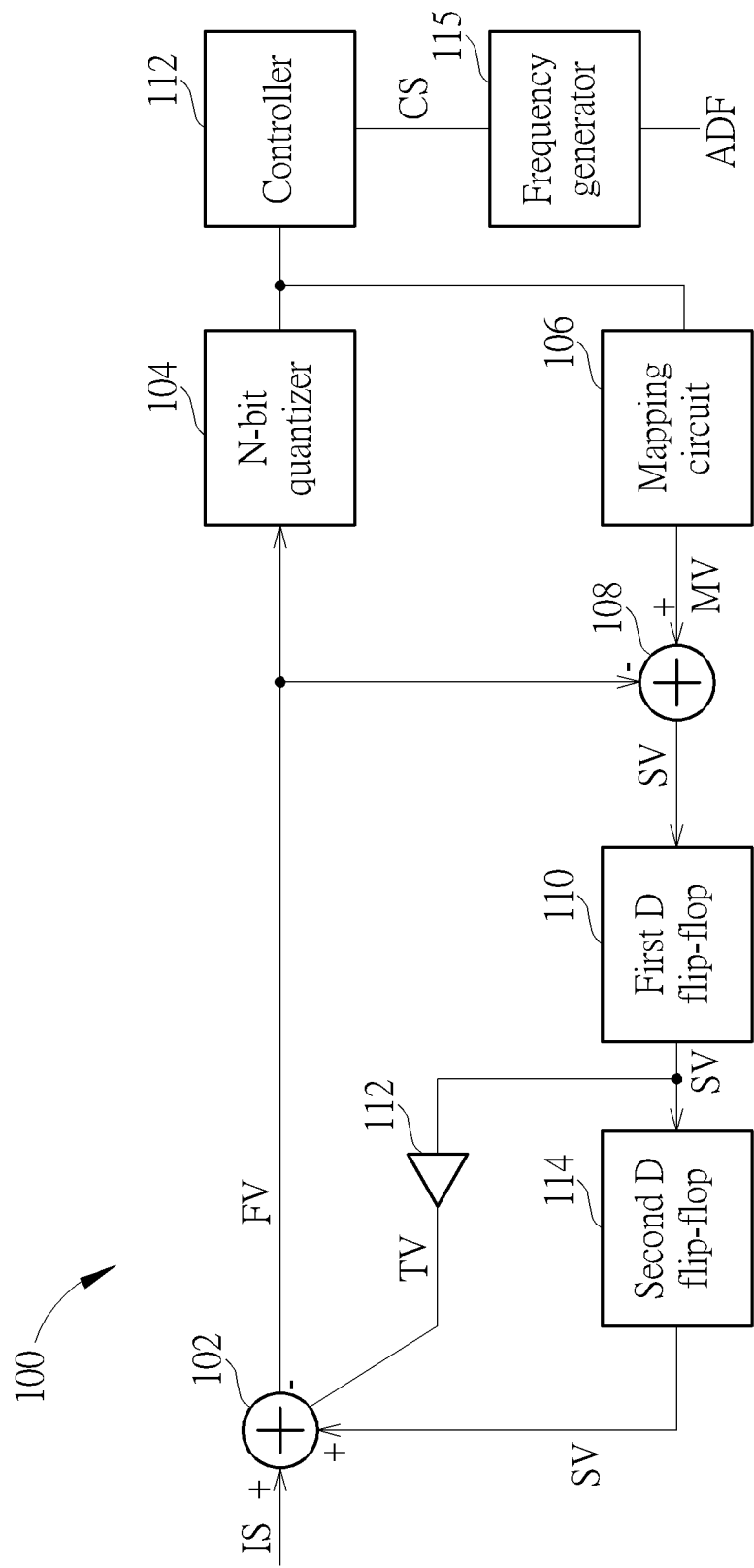
FIG. 1 is a diagram illustrating a device with a noise shaping function in sampling frequency control according to an embodiment of the present invention.

Please refer to FIG. 1. FIG. 1 is a diagram illustrating a device 100 according to an embodiment of the present invention, wherein the device 100 has a noise shaping function in sampling frequency control, and the device 100 is a second-order Sigma-Delta (ΣΔ) modulation circuit. But, the present invention is not limited to the device 100 being the second-order Sigma-Delta (ΣΔ) modulation circuit. That is to say, the device 100 can be a high-order Sigma-Delta (ΣΔ) modulation circuit.

As shown in FIG. 1, the device 100 includes a first adder 102, an N-bit quantizer 104, a mapping circuit 106, a second adder 108, and a first D flip-flop 110, a scaler 112, and a second D flip-flop 114, wherein the N-bit quantizer 104 is coupled to the first adder 102, the mapping circuit 106 is coupled to the N-bit quantizer 104, the second adder 108 is coupled to the first adder 102, the N-bit quantizer 104, and the mapping circuit 106, the first D flip-flop 110 is coupled to the second adder 108, the scaler 112 is coupled to the first D flip-flop 110 and the first adder 102, the second D flip-flop 114 is coupled to the first adder 102, the scaler 112, and the first D flip-flop 110, and N is an integer greater than 2.

As shown in FIG. 1, the first adder 102 is used for generating a first value FV according to an input signal INS, a second value SV, and a third value TV, wherein the input signal INS is a ratio of a target sampling frequency to a current sampling frequency generated by a frequency generator 115 (e.g. a crystal oscillator (quartz crystal resonator, Xtal)), and the first adder 102 subtracts the third value TV from a sum of the input signal INS and the second value SV. After the N-bit quantizer 104 receives the first value FV, the N-bit quantizer 104 can output a codeword to a controller 116 according to the first value FV, wherein the controller 116 can map the codeword to an adjusting order according to TABLE I stored in a lookup table of the controller 116. After the controller 116 maps the codeword to the adjusting order, the controller 116 can generate a control signal CS (e.g. a voltage) to the frequency generator 115 according to the adjusting order. After the frequency generator 115 receives the control signal CS, the frequency generator 115 can adjust the current sampling frequency to generate an adjusted sampling frequency ADF according to the control signal CS. When the device 100, the controller 116, and the frequency generator 115 are applied to an integrated circuit (e.g. a communication integrated circuit, an audio integrated circuit, or a sensing integrated circuit), the integrated circuit can utilize a sampling frequency generated by the frequency generator 115 to sample data to generate sampled data, and store the sampled data in a buffer of the integrated circuit. TABLE I is shown as follows:

TABLE I

| Codeword | Adjusting order |
|---|---|
| 0 | $-2^{(N-1)}$ |
| 1 | $-(2^{(N-1)} - 1)$ |
| 2 | $-(2^{(N-1)} - 2)$ |
| ⋮ | ⋮ |
| $2^{(N-1)}$ | 0 |
| ⋮ | ⋮ |
| $2^N - 2$ | $2^{(N-1)} - 2$ |
| $2^N - 1$ | $2^{(N-1)} - 1$ |

As shown in TABLE I, adjusting orders are between a smallest predetermined negative value (i.e. $-2^{(N-1)}$) and a largest positive predetermined value (i.e. $2^{(N-1)}-1$), the adjusting orders are increased from the smallest predetermined negative value (i.e. $-2^{(N-1)}$) to the largest positive predetermined value (i.e. $2^{(N-1)}-1$), and it is obvious that the smallest predetermined negative value (i.e. $-2^{(N-1)}$) and the largest positive predetermined value (i.e. $2^{(N-1)}-1$) correspond to N. In addition, as shown in TABLE I, a number of codewords outputted by the N-bit quantizer 104 is $2^N$, a smallest codeword of the codewords is 0, a largest codeword of the codewords is $2^N-1$, each codeword of the codewords is an integer, and the codewords are increased from the smallest codeword (i.e. 0) to the largest codeword (i.e. $2^N-1$).

As shown in TABLE I, each codeword of the codewords corresponds to one adjusting order of the adjusting orders. For example, if N is equal to 3, a number of the codewords outputted by the N-bit quantizer 104 is $2^3$ (=8). That is, if N is equal to 3, the codeword can be 0, 1, 2, 3, . . . , 7, wherein the codeword (0) corresponds to the adjusting order $(-2^{(3-1)})$, the codeword (1) corresponds to the adjusting order $(-(2^{(3-1)}-1))$, the codeword (7) corresponds to the adjusting order $((2^{(3-1)}-1))$, and so on.

In addition, the present invention is not limited to general forms (shown in TABLE I) of the adjusting orders, that is, the adjusting orders can have another general forms (shown in TABLE II). TABLE II is shown as follows, wherein M is a positive constant value, and M can be an integer or not:

TABLE II

| Codeword | Frequency adjusting order |
|---|---|
| 0 | $-M^{(N-1)}$ |
| 1 | $-(M^{(N-1)} - 1)$ |
| 2 | $-(M^{(N-1)} - 2)$ |
| ⋮ | ⋮ |
| $2^{(N-1)}$ | 0 |
| ⋮ | ⋮ |
| $2^N - 2$ | $(M^{(N-1)} - 2)$ |
| $2^N - 1$ | $(M^{(N-1)} - 1)$ |

Therefore, any configuration in which the adjusting orders are increased from the smallest predetermined negative value (i.e. $-2^{(N-1)}$) to the largest positive predetermined value (i.e. $2^{(N-1)}-1$) falls within the scope of the present invention.

As shown in FIG. 1, after the mapping circuit 106 receives the codeword outputted by the N-bit quantizer 104, the mapping circuit 106 can output a mapping value MV according to the codeword, wherein the mapping value MV is between 1 and −1. For example, if N is equal to 3, the mapping value MV can be one of −⅞, −⅝, −⅜, −⅛, ⅛, ⅜, ⅝, ⅞.

As shown in FIG. 1, the second adder 108 can subtract the first value from the mapping value MV to generate the second value SV. Then, the first D flip-flop 110 latches the second value SV and outputting the second value SV to the scaler 112 and the second D flip-flop 114, and the scaler 112 is used for scaling the second value SV to generate the third value TV, wherein the first D flip-flop 110, the scaler 112, and the second D flip-flop 114 are used for providing a high-pass filter effect to the device 100.

In addition, each adjusting order of the adjusting orders can correspond to one frequency adjusting level (expressed in parts per million (ppm)). For example, in one embodiment of the present invention, if N is equal to 3, the adjusting order $(-2^{(3-1)})$ corresponds to the frequency adjusting level (−4 ppm), the adjusting order $(-(2^{(3-1)}-1))$ corresponds to the frequency adjusting level (−3 ppm), the adjusting order (−($2^{(3-1)}$−2)) corresponds to the frequency adjusting level (−2 ppm), the adjusting order (−($2^{(3-1)}$−3)) corresponds to the frequency adjusting level (−1 ppm), the adjusting order (−($2^{(3-1)}$−4), i.e. 0) corresponds to the frequency adjusting level (0 ppm), the adjusting order ($2^{(3-1)}$−3) corresponds to the frequency adjusting level (1 ppm), the adjusting order ($2^{(3-1)}$−2) corresponds to the frequency adjusting level (2 ppm), and the adjusting order ($2^{(3-1)}$−1) corresponds to the frequency adjusting level (3 ppm). But, the present invention is not limited to the above-mentioned corresponding relationships between the adjusting orders and the frequency adjusting levels.

Therefore, after the controller 116 receives the codeword outputted by the N-bit quantizer 104, the controller 116 can first map the codeword to an adjusting order according to TABLE I, then map the adjusting order to a frequency adjusting level, and then generate the control signal CS (e.g. a voltage) corresponding to the frequency adjusting level. Finally, the controller 116 can apply the control signal CS to the frequency generator 115 to make the frequency generator 115 generate the adjusted sampling frequency ADF according to the control signal CS.

Figure 2:
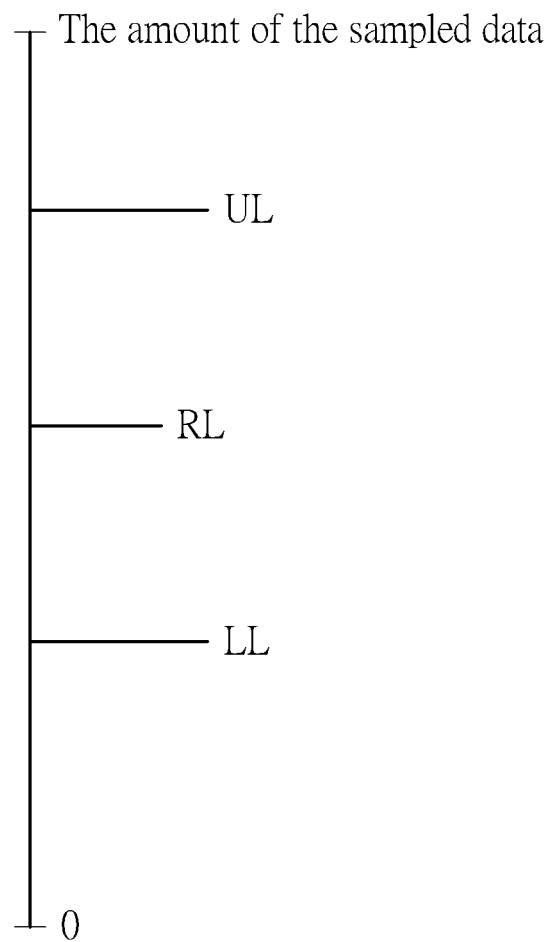
FIG. 2 is a diagram illustrating relationships between the upper level, the lower level, the reference level, and the amount of the sampled data.

For example, as shown in FIG. 2, when an amount of the sampled data in the buffer of the integrated circuit is lower than a lower level LL, it means that the current sampling frequency generated by the frequency generator 115 is less than the target sampling frequency. Meanwhile, the first adder 102 can generate the first value FV according to the input signal INS, the second value SV, and the third value TV. The N-bit quantizer 104 will output a codeword according to the first value FV. Meanwhile, the codeword outputted by the N-bit quantizer 104 can make an adjusting order mapped by the controller 116 according to the codeword outputted by the N-bit quantizer 104 be a positive predetermined value (e.g. $2^{(3-1)}$−2). Then, the controller 116 maps the positive predetermined value (e.g. $2^{(3-1)}$−2) to a frequency adjusting level (i.e. 2 ppm) and generates the control signal CS corresponding to the frequency adjusting level (i.e. 2 ppm) to the frequency generator 115. Therefore, after the frequency generator 115 receives the control signal CS corresponding to the frequency adjusting level (i.e. 2 ppm), the frequency generator 115 can generate the adjusted sampling frequency ADF according to the control signal CS corresponding to the frequency adjusting level (i.e. 2 ppm) and the current sampling frequency, wherein the adjusted sampling frequency ADF will be greater than the current sampling frequency. If the amount of the sampled data in the buffer of the integrated circuit is still lower than the lower level LL, the above-mentioned operation will be executed repeatedly until the amount of the sampled data in the buffer of the integrated circuit is between the lower level LL and an upper level UL (shown in FIG. 2), wherein the lower level LL and the upper level UL can be determined by a reference level RL, and the target sampling frequency can make the amount of the sampled data in the buffer of the integrated circuit be between the lower level LL and the upper level UL.

In addition, as shown in FIG. 2, when the amount of the sampled data in the buffer of the integrated circuit is greater than the upper level UL, it means that the current sampling frequency generated by the frequency generator 115 is greater than the target sampling frequency. Meanwhile, the first adder 102 can generate the first value FV according to the input signal INS, the second value SV, and the third value TV. The N-bit quantizer 104 will output a codeword according to the first value FV. Meanwhile, the codeword outputted by the N-bit quantizer 104 can make an adjusting order mapped by the controller 116 according to the codeword outputted by the N-bit quantizer 104 a negative predetermined value (e.g. −($2^{(N-1)}$−2)). Then, the controller 116 maps the negative predetermined value (e.g. −($2^{(N-1)}$−2)) to a frequency adjusting level (i.e. −2 ppm) and generates the control signal CS corresponding to the frequency adjusting level (i.e. −2 ppm) to the frequency generator 115. Therefore, after the frequency generator 115 receives the control signal CS corresponding to the frequency adjusting level (i.e. −2 ppm), the frequency generator 115 can generate the adjusted sampling frequency ADF according to the control signal CS corresponding to the frequency adjusting level (i.e. −2 ppm) and the current sampling frequency, wherein the adjusted sampling frequency ADF will be less than the current sampling frequency. If the amount of the sampled data in the buffer of the integrated circuit is still greater than the upper level UL, the above-mentioned operation will be executed repeatedly until the amount of the sampled data in the buffer of the integrated circuit is between the lower level LL and an upper level UL.

Because during a process of the device 100, the controller 116, and the frequency generator 115 making the adjusted sampling frequency ADF be between the lower level LL and an upper level UL according to TABLE I, TABLE I can make change of the adjusted sampling frequency ADF be discontinuous, differentiation characteristic and high-pass filter effect characteristic of the device 100 can make noise caused by discontinuous change corresponding to the adjusted sampling frequency ADF be moved to a higher frequency (that is, the noise shaping function), resulting in noise fallen in a frequency range utilized by the integrated circuit being effectively suppressed, wherein the higher frequency is outside the frequency range utilized by the integrated circuit.

In addition, one of ordinary skill in the art should clearly realize functions of the first adder 102, the N-bit quantizer 104, the mapping circuit 106, the second adder 108, the first D flip-flop 110, the scaler 112, the second D flip-flop 114, and the controller 116 through the above-mentioned corresponding descriptions of the first adder 102, the N-bit quantizer 104, the mapping circuit 106, the second adder 108, the first D flip-flop 110, the scaler 112, the second D flip-flop 114, and the controller 116, so one of ordinary skill in the art can easily implement the first adder 102, the N-bit quantizer 104, the mapping circuit 106, the second adder 108, the first D flip-flop 110, the scaler 112, the second D flip-flop 114, and the controller 116 through field programmable gate arrays (FPGAs) with the above-mentioned functions of the first adder 102, the N-bit quantizer 104, the mapping circuit 106, the second adder 108, the first D flip-flop 110, the scaler 112, the second D flip-flop 114, and the controller 116 respectively, or application-specific integrated circuits (ASICs) with the above-mentioned functions of the first adder 102, the N-bit quantizer 104, the mapping circuit 106, the second adder 108, the first D flip-flop 110, the scaler 112, the second D flip-flop 114, and the controller 116 respectively, or software modules with the above-mentioned functions of the first adder 102, the N-bit quantizer 104, the mapping circuit 106, the second adder 108, the first D flip-flop 110, the scaler 112, the second D flip-flop 114, and the controller 116 respectively, or analog integrated circuits with the above-mentioned functions of the first adder 102, the N-bit quantizer 104, the mapping circuit 106, the second adder 108, the first D flip-flop 110, the scaler 112, the second D flip-flop 114, and the controller 116 respectively. Moreover, because one of ordinary skill in the art can input codes of the above mentioned functions of the first adder 102, the N-bit quantizer 104, the mapping circuit 106, the second adder 108, the first D flip-flop 110, the scaler 112, the second D flip-flop 114, and the controller 116 to the FPGAs, or utilize intellectual property cores (IPs) of the above mentioned functions of the first adder 102, the N-bit quantizer 104, the mapping circuit 106, the second adder 108, the first D flip-flop 110, the scaler 112, the second D flip-flop 114, and the controller 116 to implement the ASICs, and the FPGAs and the IPs are obviously ready-made to one of ordinary skill in the art. Therefore, further descriptions of corresponding structures of the first adder 102, the N-bit quantizer 104, the mapping circuit 106, the second adder 108, the first D flip-flop 110, the scaler 112, the second D flip-flop 114, and the controller 116 are omitted for simplicity.

In addition, in one embodiment of the present invention, the device 100, the controller 116, and the frequency generator 115 are installed in the integrated circuit.

To sum up, because the present invention first makes the change of the adjusted sampling frequency be discontinuous, and then utilizes the differentiation characteristic and the high-pass filter effect characteristic of the device to make the noise caused by the discontinuous change of the adjusted sampling frequency be moved to the higher frequency outside the frequency range utilized by the integrated circuit, compared to the prior art, the noise fallen in the frequency range utilized by the integrated circuit can be effectively suppressed because the noise has been moved to the higher frequency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device with a noise shaping function in sampling frequency control, comprising:
   a first adder for generating a first value according to an input signal, a second value, and a third value;
   an N-bit quantizer coupled to the first adder for outputting a codeword to a controller according to the first value, wherein the codeword is mapped to an adjusting order, adjusting orders corresponding to codewords outputted by the N-bit quantizer are between a smallest predetermined negative value and a largest positive predetermined value, the controller generates a control signal to a frequency generator according to the adjusting order, the frequency generator adjusts a current sampling frequency to generate an adjusted sampling frequency according to the control signal, and N is an integer greater than 2;
   a mapping circuit coupled to the N-bit quantizer for outputting a mapping value according to the codeword;
   a second adder coupled to the first adder, the N-bit quantizer, and the mapping circuit for generating the second value according to the mapping value and the first value;
   a first D flip-flop coupled to the second adder for latching the second value;
   a scaler coupled to the first D flip-flop and the first adder for scaling the second value to generate the third value; and
   a second D flip-flop coupled to the first adder, the scaler, and the first D flip-flop for latching the second value and outputting the second value to the first adder.

2. The device of claim 1, wherein the input signal is a ratio of a target sampling frequency to the current sampling frequency.

3. The device of claim 1, wherein the device is a second-order Sigma-Delta ($\Sigma\Delta$) modulation circuit.

4. The device of claim 1, wherein a number of the codewords is $2^N$, a smallest codeword of the codewords is 0, a largest codeword of the codewords is $2^N-1$, and the codewords are increased from the smallest codeword to the largest codeword.

5. The device of claim 1, wherein the smallest predetermined negative value and the largest positive predetermined value correspond to N.

6. The device of claim 1, wherein the smallest predetermined negative value is $-2^{(N-1)}$ and the largest positive predetermined value is $2^{(N-1)}-1$.

7. The device of claim 1, wherein the adjusting orders are increased from the smallest predetermined negative value to the largest positive predetermined value.

8. The device of claim 1, wherein the mapping value is between 1 and −1.

9. The device of claim 1, wherein the current sampling frequency is generated by the frequency generator.

10. The device of claim 1, wherein the controller maps the adjusting order to a frequency adjusting level and further makes the frequency generator adjust the current sampling frequency to generate the adjusted sampling frequency according to the frequency adjusting level.

11. The device of claim 1, wherein the adjusting orders makes a change of the adjusted sampling frequency be discontinuous.

12. The device of claim 11, wherein differentiation characteristic and high-pass filter effect characteristic of the device make noise caused by discontinuous change of the adjusted sampling frequency be moved to a high frequency outside a frequency range utilized by an integrated circuit.

13. A device with a noise shaping function in sampling frequency control, comprising:
   a first adder for generating a first value according to an input signal, a second value, and a third value;
   a controller;
   a frequency generator;
   an N-bit quantizer coupled to the first adder for outputting a codeword to a controller according to the first value, wherein the codeword is mapped to an adjusting order, adjusting orders corresponding to codewords outputted by the N-bit quantizer are between a smallest predetermined negative value and a largest positive predetermined value, the controller generates a control signal to the frequency generator according to the adjusting order, the frequency generator adjusts a current sampling frequency to generate an adjusted sampling frequency according to the control signal, and N is an integer greater than 2;
   a mapping circuit coupled to the N-bit quantizer for outputting a mapping value according to the codeword;
   a second adder coupled to the first adder, the N-bit quantizer, and the mapping circuit for generating the second value according to the mapping value and the first value;
   a first D flip-flop coupled to the second adder for latching the second value;
   a scaler coupled to the first D flip-flop and the first adder for scaling the second value to generate the third value; and a second D flip-flop coupled to the first adder, the scaler, and the first D flip-flop for latching the second value and outputting the second value to the first adder.

\* \* \* \* \*